US011424215B2

(12) United States Patent
Hou et al.

(10) Patent No.: US 11,424,215 B2
(45) Date of Patent: Aug. 23, 2022

(54) BONDED ASSEMBLY FORMED BY HYBRID WAFER BONDING USING SELECTIVELY DEPOSITED METAL LINERS

(71) Applicant: SANDISK TECHNOLOGIES LLC, Addison, TX (US)

(72) Inventors: Lin Hou, Leuven (BE); Peter Rabkin, Cupertino, CA (US); Yangyin Chen, Leuven (BE); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/094,543

(22) Filed: Nov. 10, 2020

(65) Prior Publication Data

US 2022/0149002 A1    May 12, 2022

(51) Int. Cl.
| | | |
|---|---|---|
| H01L 23/00 | (2006.01) | |
| H01L 25/00 | (2006.01) | |
| H01L 27/11582 | (2017.01) | |
| H01L 21/50 | (2006.01) | |
| H01L 23/532 | (2006.01) | |

(Continued)

(52) U.S. Cl.
CPC .............. *H01L 24/80* (2013.01); *H01L 21/50* (2013.01); *H01L 23/53228* (2013.01); *H01L 24/05* (2013.01); *H01L 24/08* (2013.01); *H01L 25/50* (2013.01); *H01L 27/11556* (2013.01); *H01L 27/11582* (2013.01); *H01L 21/60* (2021.08)

(58) Field of Classification Search
CPC ... H01L 24/80; H01L 21/50; H01L 23/53228; H01L 24/05; H01L 24/08; H01L 25/50; H01L 27/11556; H01L 27/11582; H01L 21/60
See application file for complete search history.

(56) References Cited

U.S. PATENT DOCUMENTS

| | | |
|---|---|---|
| 10,354,980 B1 | 7/2019 | Mushiga et al. |
| 10,354,987 B1 | 7/2019 | Mushiga et al. |

(Continued)

FOREIGN PATENT DOCUMENTS

KR    10-1999-0017335 A    3/1999

OTHER PUBLICATIONS

Beyne, E. et al., "Scalable, sub 2μm pitch, Cu/SiCN to Cu/SiCN hybrid wafer-to-wafer bonding technology." 2017 IEEE International Electron Devices Meeting (IEDM). IEEE, 2017.

(Continued)

*Primary Examiner* — Mamadou L Diallo
(74) *Attorney, Agent, or Firm* — The Marbury Law Group PLLC

(57) ABSTRACT

A nucleation suppression layer including a self-assembly material can be formed on a surface of a bonding dielectric layer without depositing the self-assembly material on physically exposed surfaces of first metal bonding pads of a first semiconductor die. Metallic liners including a second metal can be formed on the physically exposed surfaces of the metal bonding pads without depositing the second metal on the nucleation suppression layer. The first semiconductor die is bonded to a second semiconductor die by inducing metal-to-metal bonding between mating pairs of the first metal bonding pads and second metal bonding pads of the second semiconductor die.

19 Claims, 11 Drawing Sheets

(51) Int. Cl.
*H01L 27/11556* (2017.01)
*H01L 21/60* (2006.01)

(56) References Cited

U.S. PATENT DOCUMENTS

| | | | |
|---|---|---|---|
| 10,510,738 | B2 | 12/2019 | Kim et al. |
| 10,790,262 | B2* | 9/2020 | Uzoh ............... H01L 25/50 |
| 10,797,062 | B1 | 10/2020 | Nishikawa et al. |
| 2006/0220197 | A1* | 10/2006 | Kobrinsky ......... H01L 24/81 257/678 |
| 2013/0207204 | A1* | 8/2013 | Widdershoven ........................ H01L 23/53238 257/414 |
| 2017/0062366 | A1 | 3/2017 | Enquist |
| 2017/0179029 | A1* | 6/2017 | Enquist ............. H01L 24/05 |
| 2018/0175012 | A1 | 6/2018 | Wu et al. |
| 2019/0221557 | A1 | 7/2019 | Kim et al. |
| 2020/0027509 | A1* | 1/2020 | Chen ............... H01L 27/11548 |
| 2020/0051945 | A1 | 2/2020 | Pan et al. |
| 2020/0102650 | A1 | 4/2020 | Hausmann et al. |
| 2021/0320094 | A1* | 10/2021 | Zhang ............. H01L 27/11582 |
| 2021/0320122 | A1* | 10/2021 | Zhang ............. H01L 27/11565 |
| 2021/0335780 | A1* | 10/2021 | Yang ................. G11C 16/26 |
| 2021/0391315 | A1* | 12/2021 | Zhang ................ H01L 25/50 |

OTHER PUBLICATIONS

Chen, K. et al., "Copper Bonded Layers Analysis and Effects of Copper Surface Conditions on Bonding Quality for Three-Dimensional Integration," J. Electron. Mater., 34(12), pp. 1464-1467.

Chu, Schubert S. "Atomic Layer Deposition (ALD) Processes for ULSI Manufacturing." Advanced Nanoscale ULSI Interconnects: Fundamentals and Applications. Springer, New York, NY, 2009. 207-220.

Endoh et al., "Novel Ultra High Density Memory with a Stacked-Surrounding Gate Transistor (S-SGT) Structured Cell," IEDM Proc. (2001) 33-36.

Fan, J. et al., "Effects of Surface Treatment on the Bonding Quality of Wafer-Level Cu-to-Cu Thermo-Compression Bonding for 3D Integration," J. Micromech. Microeng., 23, p. 045025.

Huang, Y.P. et al., "Demonstration and Electrical Performance of Cu—Cu Bonding at 150° C with Pd Passivation," IEEE Trans. Electron. Devices, 62(8), pp. 2587-2592.

Huang, Y.P. et al., "Novel Cu-to-Cu Bonding with Ti Passivation at 180 C in 3-D Integration," IEEE Electron. Dev. Lett., 34(12), pp. 1551-1553.

Huffman, A. et al., "Fabrication and Characterization of Metal-to-Metal Interconnect Structures for 3-D Integration," J. Instrum., 4(3), p. P03006.

Jang, E.J. et al., "Effect of Wet Pretreatment on Interfacial Adhesion Energy of Cu—Cu Thermocompression Bond for 3D IC Packages," J. Electron. Mater., 38, pp. 2449-2454.

Ko, C.T. et al., "Low temperature bonding technology for 3D integration." Microelectronics reliability 52.2 (2012): 302-311.

Ko, C.T. et al., "Study on Low Temperature Cu Bonding and Temporary Bond/De-Bond for RDL-First Fan-out Panel Level Package," IEEE 5th International Workshop on Low Temperature Bonding for 3D Integration (LTB-3D), Tokyo, Japan, May 16-18.

Moriceau, H. et al., "Low Temperature Direct Bonding: An Attractive Technique for Heterostructures Build-up," Microelectronics Reliability, vol. 52, No. 2, p. 331-341.

Panigrahi, A.K. et al., "Oxidation Resistive, CMOS Compatible Copper Based Alloy Ultrathin Films as a Superior Passivation Mechanism for Achieving 150 C Cu—Cu Wafer on Wafer Thermocompression Bonding," IEEE Trans. Electron. Dev., 64(3), pp. 1239-1245.

Peng, L., et al., "High Density Bump-Less Cu—Cu Bonding with Enhanced Quality Achieved by Pre-Bonding Temporary Passivation for 3D Wafer Stacking," IEEE International Symposium on VLSI Technology, Systems and Applications (VLSI-TSA), Hsinchu, Taiwan, Apr. 25-27, pp. 1-2.

Suga, T. et al., "Surface Activated Bonding for New Flip Chip and Bumpless Interconnect Systems," 52nd IEEE Electronic Components and Technology Conference (ECTC), San Diego, CA, May 28-31, pp. 105-111.

Swinnen, B. et al., "3D Integration by Cu—Cu Thermo-Compression Bonding of Extremely Thinned Bulk-Si Die Containing 10 lm Pitch Through-Si Vias," International Electron Devices Meeting (IEDM), San Francisco, CA, Dec. 11-13, pp. 1-4.

Takagi, H. et al., "Surface Activated Bonding of Silicon Wafers at Room Temperature," Appl. Phys. Lett., 68(16), pp. 2222-2224.

Wang, Y.H. et al., "20-lm-Pitch Au Micro-Bump Interconnection at Room Temperature in Ambient Air," 58th IEEE Electronic Components and Technology Conference (ECTC), Lake Buena Vista, FL, May 27-30, pp. 944-949.

Yang, Y.T. et al., "Low Temperature Cu—Cu Direct Bonding Using Pillar-Concave Structure in Advanced 3D Heterogeneous Integration," IEEE Trans. Compon., Packag. Manuf. Technol., 7(9), pp. 1560-1566.

U.S. Appl. No. 16/523,029, filed Jul. 26, 2019, SanDisk Technologies LLC.

U.S. Appl. No. 16/728,327, filed Dec. 27, 2019, SanDisk Technologies LLC.

U.S. Appl. No. 16/742,213, filed Jan. 14, 2020, SanDisk Technologies LLC.

U.S. Appl. No. 16/774,446, filed Jan. 28, 2020, SanDisk Technologies LLC.

U.S. Appl. No. 16/851,839, filed Apr. 17, 2020, SanDisk Technologies LLC.

U.S. Appl. No. 16/851,908, filed Apr. 17, 2020, SanDisk Technologies LLC.

Notification of Transmittal of the International Search Report and the Written Opinion of the International Searching Authority for International Patent Application No. PCT/US2021/034306, dated Oct. 28, 2021, 10 pages.

\* cited by examiner

US 11,424,215 B2

BONDED ASSEMBLY FORMED BY HYBRID WAFER BONDING USING SELECTIVELY DEPOSITED METAL LINERS

FIELD

The present disclosure relates generally to the field of semiconductor devices, and particularly to a bonded assembly employing selectively grown metal liners for hybrid wafer bonding and methods for forming the same.

BACKGROUND

A memory die including a three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a method of forming a bonded assembly comprises providing a first semiconductor die comprising first semiconductor devices, a first bonding dielectric layer, and first metal bonding pads that comprise a first metal, are electrically connected to a respective node of the first semiconductor devices, and are embedded in the first bonding dielectric layer, selectively depositing a first nucleation suppression layer comprising a self-assembly material on a surface of the first bonding dielectric layer without depositing the self-assembly material on physically exposed surfaces of the first metal bonding pads, selectively depositing first metallic liners comprising a second metal on the physically exposed surfaces of the first metal bonding pads without depositing the second metal on the first nucleation suppression layer, providing a second semiconductor die comprising second semiconductor devices, a second bonding dielectric layer, and second metal bonding pads that are electrically connected to a respective node of the second semiconductor devices, and are embedded in the second bonding dielectric layer, and bonding the second metal bonding pads with the first metal bonding pads by inducing metal-to-metal bonding between each mating pair of the first metal bonding pads and the second metal bonding pads.

According to another embodiment, a bonded assembly comprises a first semiconductor die comprising first semiconductor devices, first metal interconnect structures embedded in first dielectric material layers, and first metal bonding pads comprising a first metal and embedded in a first bonding dielectric layer, a second semiconductor die comprising second semiconductor devices, second metal interconnect structures embedded in second dielectric material layers, and second metal bonding pads comprising the first metal and embedded in a second bonding dielectric layer and bonded to a respective one of the first metal bonding pads, interfacial alloy regions comprising an alloy of the first metal and a second metal that is different from the first metal located between each of the first metal bonding pads and each of the second metal bonding pads bonded to the respective one of the first metal bonding pads, and an interfacial dielectric region located at an interface between the first bonding dielectric layer and the second bonding dielectric layer, wherein the interfacial dielectric region comprises carbon atoms at an average atomic concentration that is greater than twice an average atomic concentration of carbon in the first bonding dielectric layer and is greater than twice an average atomic concentration of carbon in the second bonding dielectric layer.

DETAILED DESCRIPTION

Figure 1:
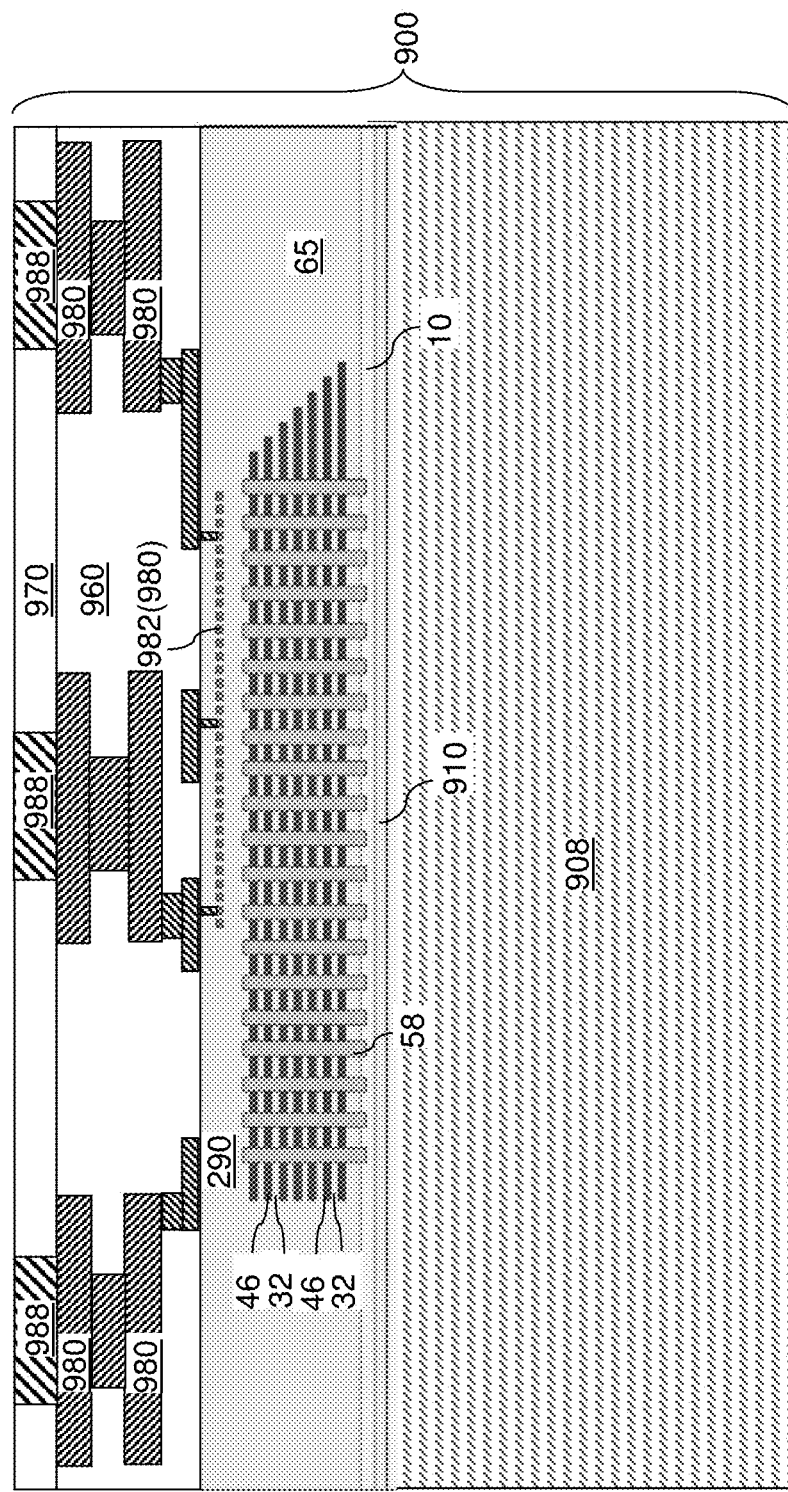
FIG. 1 is a schematic vertical cross-sectional view of a first semiconductor die after formation of a first bonding dielectric layer and first metal bonding pads according to an embodiment of the present disclosure.

Metal-to-metal wafer bonding or die-to-die bonding may be used to attach a logic die including a peripheral (i.e., driver) circuit to the memory die. Oxidation of copper metal on the bonding surfaces degrades the quality of metal-to-metal bonding, and increases the temperature and duration of the bonding process. This adversely affects the quality of metal-to-metal bonding and increases the processing cost.

Embodiments of the present disclosure are directed to a bonded assembly employing selectively grown metal liners for hybrid wafer bonding and methods for forming the same, the various aspects of which are described herein in detail. The hybrid bonding and the selectively grown metal liners permit a lower bonding temperature and/or bonding process duration, which improves the quality of the bonded assembly.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first semiconductor die 900 according to an embodiment of the present disclosure is illustrated. The first semiconductor die 900 includes a first substrate 908, first semiconductor devices 920 overlying the first substrate 908, first dielectric material layers (290, 960, 970) overlying the first semiconductor devices, and first metal interconnect structures 980 embedded in the first dielectric material layers (290, 960, 970). In one embodiment, the first substrate 908 may be a commercially available silicon wafer having a thickness in a range from 500 microns to 1 mm.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

The first dielectric material layers (290, 960, 970) may include first contact-level dielectric layers 290 embedding contact via structures and bit lines 982, first interconnect-level dielectric layers 960 that embed a subset of the first metal interconnect structures 980 located above the first contact-level dielectric layers 290, and a first bonding dielectric layer 970 that is formed above the first interconnect-level dielectric layer 960. The bit lines 982 are a subset of the first metal interconnect structures 980 and may electrically contact drain regions located above the semiconductor channel at the top of the memory opening fill structures 58. The contact via structures contact various nodes of the first semiconductor devices. Interconnect metal lines and interconnect metal via structures, which are subsets of the first metal interconnect structures 980) may be embedded in the first interconnect-level dielectric layers 960. The first metal interconnect structures 980 may be located within the first interconnect-level dielectric layers 960 or within the first bonding dielectric layer 970.

Each of the first contact-level dielectric layers 290 and the first interconnect-level dielectric layers 960 may include a dielectric material such as undoped silicate glass, a doped silicate glass, organosilicate glass, silicon nitride, a dielectric metal oxide, or a combination thereof. The first bonding dielectric layer 970 comprises, and/or consists essentially of, a dielectric material that can be bonded to another dielectric material by dielectric-to-dielectric bonding. For example, the first bonding dielectric layer 970 may include, and/or consist essentially of, a silicon oxide material such as undoped silicate glass (e.g., silicon oxide), silicon nitride, or a doped silicate glass, or silicon carbide nitride (i.e., silicon carbonitride, "SiCN"). The thickness of the first bonding dielectric layer 970 may be in a range from 100 nm to 3,000 nm, although lesser and greater thicknesses may also be employed. The first bonding dielectric layer 970 may have a planar top surface, which may be provided, for example, by a planarization process such as a chemical mechanical polishing (CMP) process. A topmost layer of the first interconnect-level dielectric layers 960 may be a dielectric diffusion barrier layer (not expressly shown), which may be a silicon nitride layer having a thickness in a range from 10 nm to 300 nm. Alternatively, the diffusion barrier layer may be omitted.

First metal bonding pads 988 are formed in the first bonding dielectric layer 970, for example, by forming pad cavities in the first bonding dielectric layer 970 and filling the pad cavities with at least one conductive material comprising a first metal. Alternatively, the metal bonding pads 988 are formed on the first metal interconnect structures 980 first, followed by forming the first bonding dielectric layer 970 over and around the first metal bonding pads 988, followed by planarizing the first bonding dielectric layer 970 to expose the top surface of the first metal bonding pads 988. The at least one conductive material may be a metallic (i.e., metal or metal alloy) material that may be bonded to the same metallic material or to another metallic material by metal-to-metal or hybrid bonding. In one embodiment, each of the first metal bonding pads 988 may include an optional metallic liner that includes TiN, TaN, and/or WN, and a metal fill material portion that includes a first metal that may be bonded to another portion of the first metal or to another metallic material by metal-to-metal bonding. In one embodiment, the first metal may be copper or any other metal capable of providing metal-to-metal bonding. For example, the metal fill material portion may include, and/or consist essentially of, any material selected from Cu, a copper alloy including copper at an atomic concentration greater than 70% (which may be greater than 90% and/or 95%).

Generally, the first metal bonding pads 988 comprise the first metal, are electrically connected to a respective node of the first semiconductor devices 920, and are embedded in the first bonding dielectric layer 970. Each of the first metal bonding pads 988 is surrounded by the first bonding dielectric layer 970 and contacts a respective underlying one of the first metal interconnect structures 980.

Figure 2:
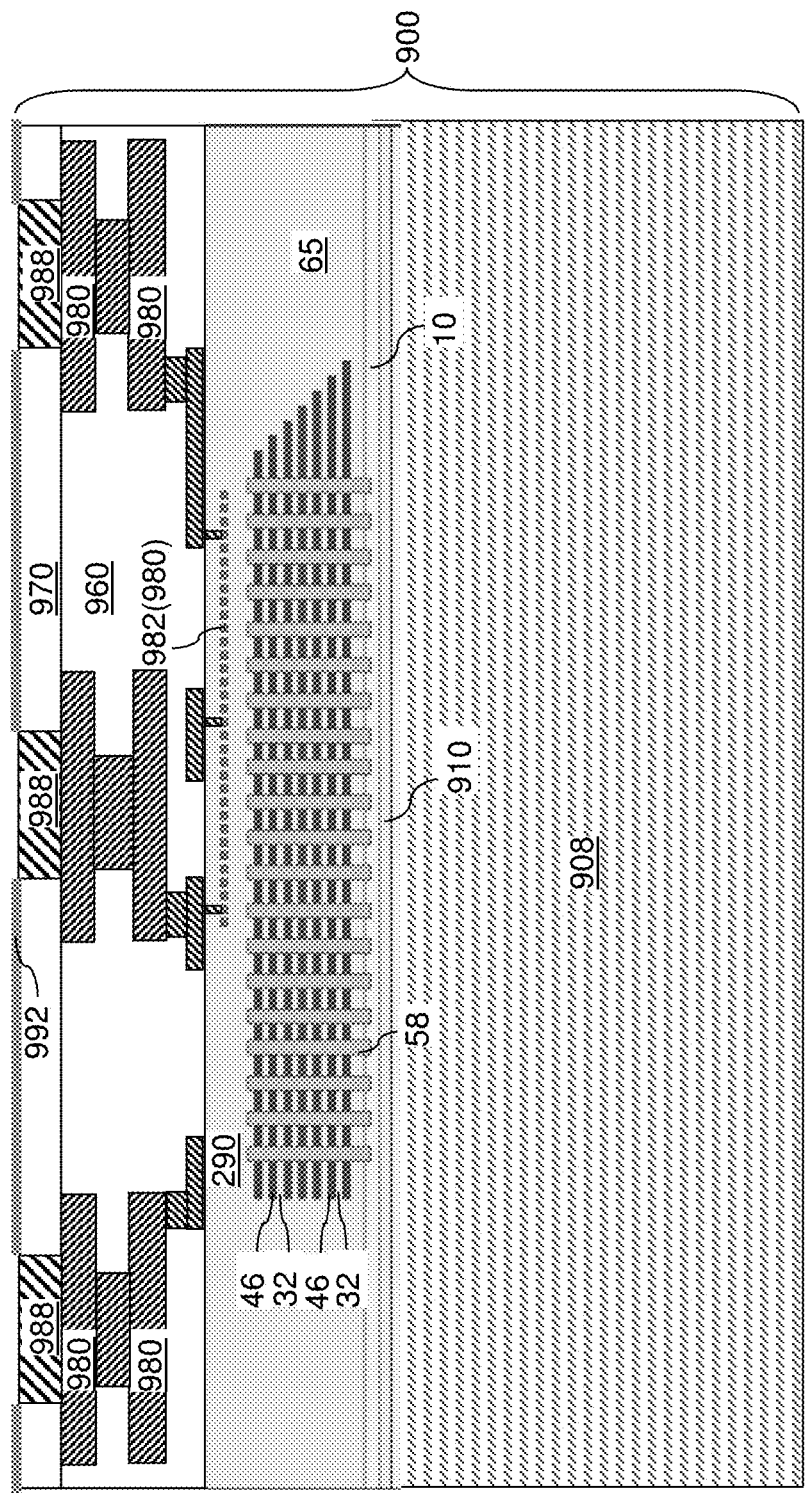
FIG. 2 is a schematic vertical cross-sectional view of the first semiconductor die after selective deposition of a first nucleation suppression layer according to an embodiment of the present disclosure.
Figure 3:
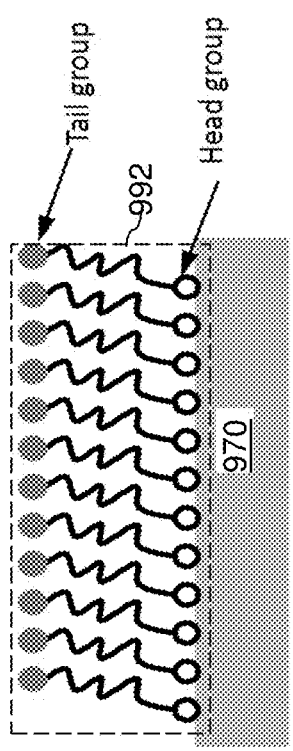
FIG. 3 is a magnified view of a region of the first nucleation suppression layer of FIG. 2.

Referring to FIGS. 2 and 3, a first nucleation suppression layer 992 may be formed on the physically exposed surfaces (e.g., top surface) of the first bonding dielectric layer 970. The first nucleation suppression layer 992 comprises a material which suppresses nucleation of a metallic material thereupon during a subsequent metal deposition process. Generally, the dielectric material of the first bonding dielectric layer 970 (such as silicon oxide or silicon carbide nitride) does not provide sufficient suppression of deposition of a metallic material thereupon. The function of the first nucleation suppression layer 992 is to provide suppression of nucleation of a metallic material during a subsequent metallic material deposition process, and thereby to prevent deposition of the metallic material over the areas of the first bonding dielectric layer 970. The first nucleation suppression layer 992 is selectively deposited on the physically exposed surfaces of the first bonding dielectric layer 970 without deposition of the first nucleation suppression material on the physically exposed surfaces of the first metal bonding pads 988. Thus, the first nucleation suppression layer 992 may be formed as discrete material portions that are located on a top surface of the first bonding dielectric layer 970.

In one embodiment, the nucleation suppression material may be an organic material, such as an organic self-assembly material (SAM), which is also referred to as a self-assembly monolayer if the material is about one monolayer thick. The organic nucleation suppression material may be carbon-based, and may include silicon atoms. In one embodiment, the nucleation suppression material molecule may optionally include at least one silicon atom, may optionally include at least one hydrogen atom and/or may optionally include at least one chlorine atom per molecule. In one embodiment, the first nucleation suppression layer 992 may be formed by a selective deposition process in which the first nucleation suppression material is chemically bonded to the physically exposed surfaces of the first bonding dielectric layer 970 without attachment to the physically exposed surfaces of the first metal bonding pads 988.

In one embodiment, the first nucleation suppression layer 992 may include a monolayer of the self-assembly material. In one embodiment, the self-assembly material may include a silicon-containing carbon-based self-assembly material such octadecyltrichlorosilane ("ODTS") ($C_{18}H_{37}Cl_3Si$), decyltrichlorosilane ("DTS") ($C_{10}H_{21}Cl_3Si$), or octylsilane ("OTS") ($C_8H_{20}Si$). Thus, the self-assembly material may be self-assembled onto the physically exposed surfaces of the first bonding dielectric layer 970 without being attached to the first metal bonding pads 988 by depositing a suspension containing the SAM precursors onto the first metal bonding pads 988 and the first bonding dielectric layer 970. In some embodiments shown in FIG. 3, each molecule of the SAM material may include a head group that has affinity to the dielectric material of the first bonding dielectric layer 970 but not to the first metal bonding pads 988, and a tail group that does not have affinity to the dielectric material of the first bonding dielectric layer 970 and to the first metal bonding pads 988.

Figure 4:
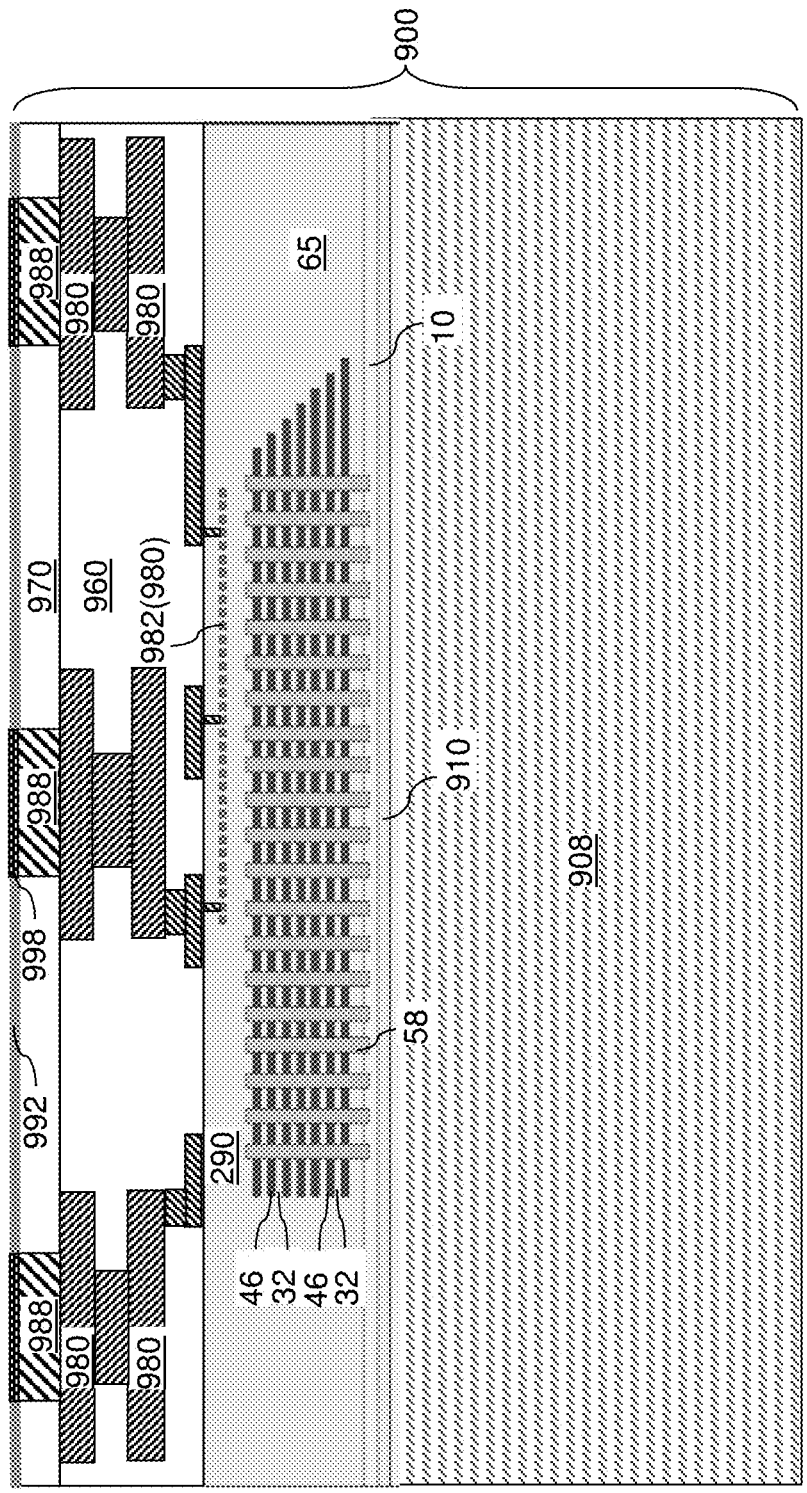
FIG. 4 is a schematic vertical cross-sectional view of the first semiconductor die after selective deposition of first metallic liners according to an embodiment of the present disclosure.

Referring to FIG. 4, an atomic layer deposition (ALD) process can be performed to selectively deposit a second metal on the physically exposed metallic surfaces of the first metal bonding pads 988 without depositing the second metal on the surfaces of the first nucleation suppression layer 992. The second metal is different from the first metal. Generally, the second metal includes a metal that is more resistant to oxidation than the first metal. In one embodiment, the first metal is copper, and the second metal is a noble metal. In an illustrative example, the second metal comprises an element selected from palladium, platinum, iridium, osmium, ruthenium, gold, or silver.

During the atomic layer deposition process, a metalorganic precursor gas including the second metal can be flowed into a process chamber including the first semiconductor die 900. The species of the metalorganic precursor gas can be selected based on the second metal and the material of the first nucleation suppression layer 992 (i.e., the self-assembly material). The metalorganic precursor gas can be selected such that molecules of the metalorganic precursor gas is selectively adsorbed on, and is decomposed over, the physically exposed surfaces of the first metal bonding pads 988 to form first metallic liners 998 consisting essentially of the second metal. Thus, the metalorganic precursor gas nucleates on surfaces of the first metal without nucleating on surfaces of the first nucleation suppression layer 992. The metalorganic precursor gas does not adsorb on the surfaces of the first nucleation suppression layer 992, and thus, the first metallic liners 998 are not formed over the first nucleation suppression layer 992. Generally, the first metallic liners 998 comprising the second metal can be selectively deposited on the physically exposed surfaces of the first metal bonding pads 988 without depositing the second metal on the first nucleation suppression layer 992. The thickness of the first metallic liners 998 can be selected such that the first metal of the first metal bonding pads 988 can diffuse through the first metallic liners 998 during a subsequent anneal process. For example, the thickness of the first metallic liners 998 can be in a range from 2 nm to 15 nm, such as from 5 nm to 10 nm, although lesser and greater thicknesses may also be employed.

Figure 5:
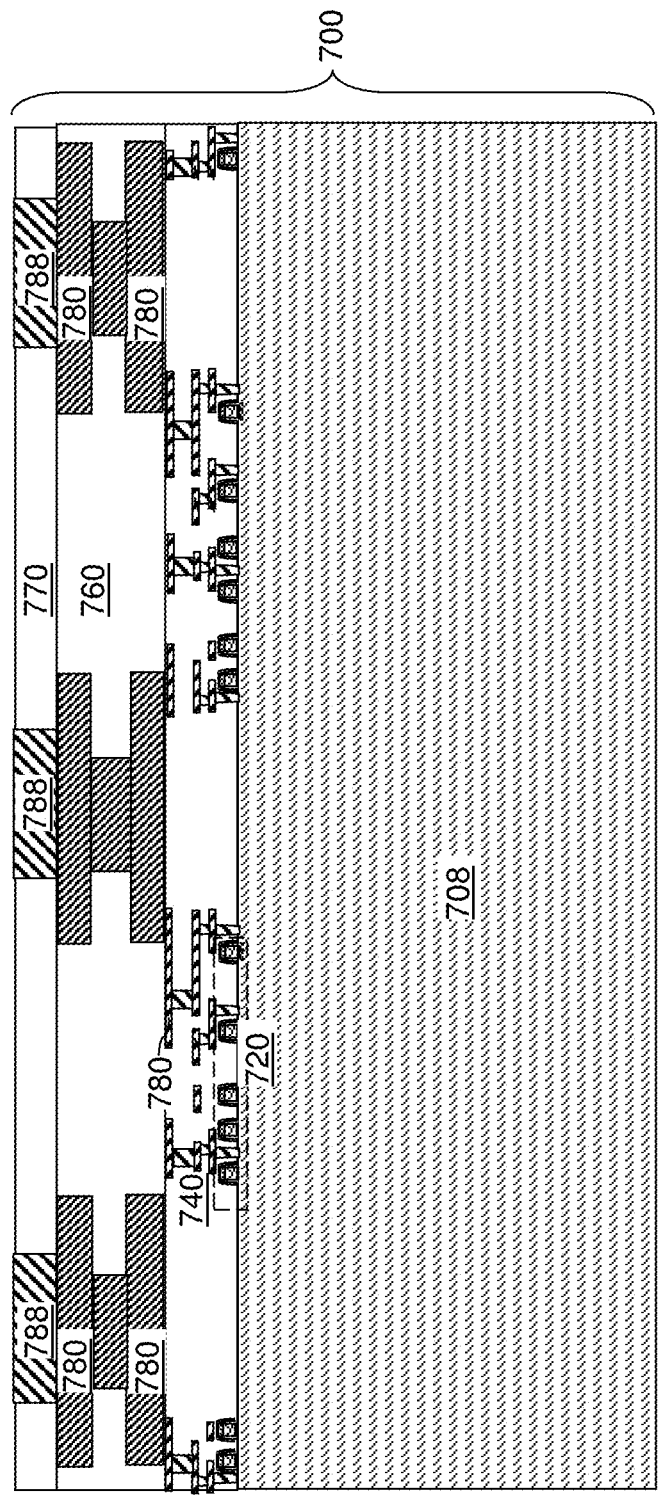
FIG. 5 is a schematic vertical cross-sectional view of a second semiconductor die according to an embodiment of the present disclosure.

Referring to FIG. 5, a second semiconductor die 700 is illustrated. The second semiconductor die 700 includes a second substrate 708, second semiconductor devices 720 overlying the second substrate 708, second dielectric material layers (740, 760, 770) overlying the second semiconductor devices 720, and second metal interconnect structures 780 embedded in the second dielectric material layers (740, 760, 770). In one embodiment, the second semiconductor devices 720 may include at least one complementary metal oxide semiconductor (CMOS) circuitry including field effect transistors. In one embodiment, the second substrate 708 may be a commercially available silicon substrate having a thickness in a range from 500 microns to 1 mm.

Generally, the second semiconductor devices may comprise any semiconductor device that may be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support circuitry (i.e., a peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive lines 46), and bit lines 982, the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

The second dielectric material layers (740, 760, 770) may include proximal interconnect-level dielectric layers 740 embedding a proximal subset of the second metal interconnect structures 780 that is proximal to the second substrate 708, distal interconnect-level dielectric layers 760 embedding a distal subset of second metal interconnect structures 780 that is distal from the second substrate 708, and a second bonding dielectric layer 770 that is formed above the distal interconnect-level dielectric layers 760. The second metal interconnect structures 780 may be located within the proximal interconnect-level dielectric layer 740, within the distal interconnect-level dielectric layers 760, or within the second bonding dielectric layer 770.

The proximal interconnect-level dielectric layers 740 and the distal interconnect-level dielectric layers 760 may include a dielectric material such as undoped silicate glass (e.g., silicon oxide), a doped silicate glass, organosilicate glass, silicon nitride, a dielectric metal oxide, or a combination thereof. The second bonding dielectric layer 770 may include undoped silicate glass, a doped silicate glass (e.g., a doped or undoped silicon oxide material), silicon nitride, or silicon nitride carbide (i.e., silicon carbonitride). The thickness of the second bonding dielectric layer 770 may be in a range from 100 nm to 3,000 nm, although lesser and greater thicknesses may also be employed. The second bonding dielectric layer 770 may have a planar top surface, which may be provided, for example, by a planarization process such as a chemical mechanical polishing (CMP) process.

Second metal bonding pads 788 are formed in the second bonding dielectric layer 770, for example, by forming pad cavities in the second bonding dielectric layer 770 and filling the pad cavities with at least one conductive material comprising the first metal. Alternatively, the metal bonding pads 788 are formed on the second metal interconnect structures 780 first, followed by forming the second bonding dielectric layer 770 over and around the second metal bonding pads 788, followed by planarizing the second bonding dielectric layer 770 to expose the top surface of the second metal bonding pads 788. The at least one conductive material may be a metallic (i.e., metal or metal alloy) material that may be bonded to the same metallic material or to another metallic material by metal-to-metal or hybrid bonding. In one embodiment, each of the first metal bonding pads 988 may include an optional metallic liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%). The material of the second metal bonding pads 788 may be the same as, or may be different from, the material of the first metal bonding pads 988.

Generally, the second metal bonding pads 788 comprise the first metal, are electrically connected to a respective node of the second semiconductor devices 720, and are embedded in the second bonding dielectric layer 770. Each of the second metal bonding pads 788 is embedded in the second bonding dielectric layer 770 and contacts a respective underlying one of the second metal interconnect structures 780.

The types of devices of the first semiconductor die 900 and of the second semiconductor die 700 may be selected in any manner such that the devices 920 of the first semiconductor die 900 and the devices 720 of the second semiconductor die 700 may communicate with each other, and control, and or are controlled by, devices in the other semiconductor die. In one embodiment, one of the first semiconductor die 900 and the second semiconductor die 700 comprises a memory die including memory elements, such as a three-dimensional array of memory elements, and another of the first semiconductor die 900 and the second semiconductor die 700 comprises a logic die including peripheral circuitry configured to operate the memory elements, such as the three-dimensional array of memory elements.

Figure 6:
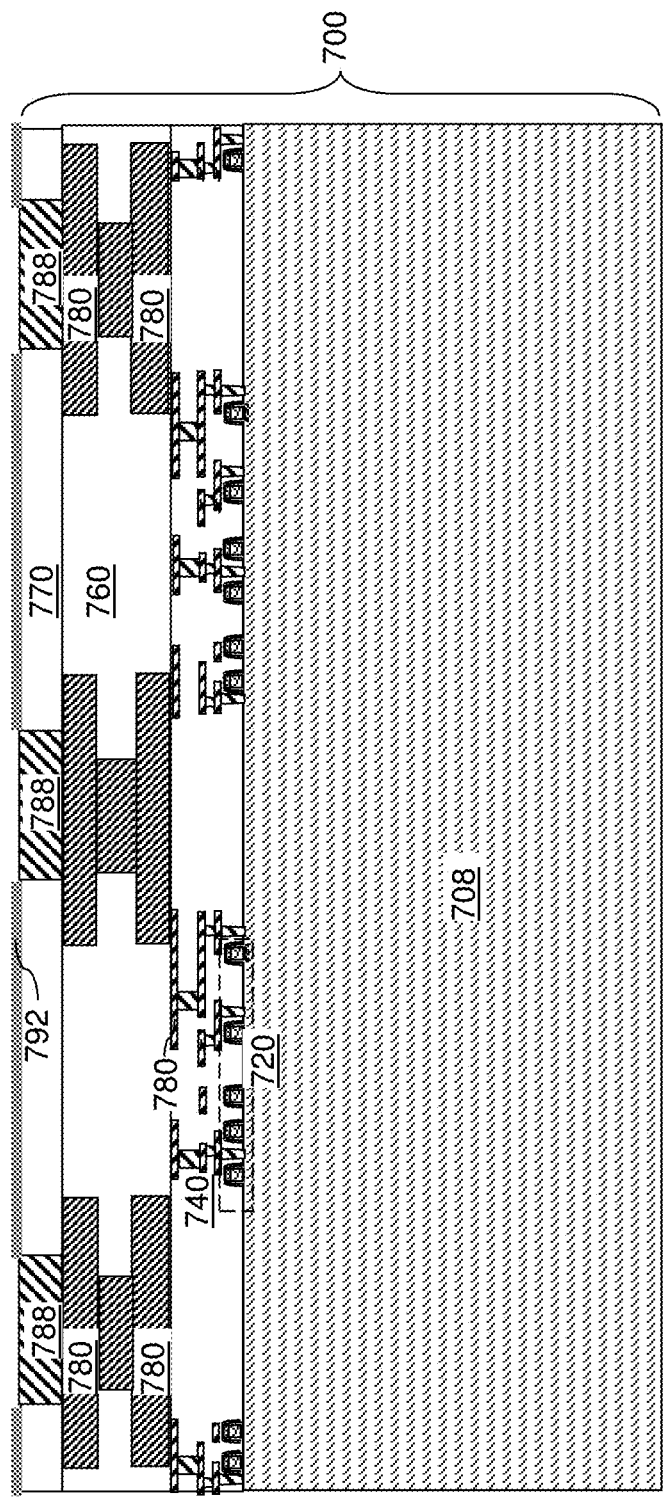
FIG. 6 is a schematic vertical cross-sectional view of the second semiconductor die after selective deposition of a second nucleation suppression layer according to an embodiment of the present disclosure.

Referring to FIG. 6, a second nucleation suppression layer 792 may be formed on the physically exposed surfaces (e.g., top surface) of the second bonding dielectric layer 770. The second nucleation suppression layer 792 comprises a material which suppresses nucleation of a metallic material thereupon during a subsequent metal deposition process. Generally, the dielectric material of the second bonding dielectric layer 770 (such as silicon oxide, silicon nitride or silicon carbide nitride) does not provide sufficient suppression of deposition of a metallic material thereupon. The function of the second nucleation suppression layer 792 is to provide suppression of nucleation of a metallic material during a subsequent metallic material deposition process, and thereby to prevent deposition of the metallic material over the areas of the second bonding dielectric layer 770. The second nucleation suppression layer 792 is selectively deposited on the physically exposed surfaces of the second bonding dielectric layer 770 without deposition of the second nucleation suppression material on the physically exposed surfaces of the second metal bonding pads 788. Thus, the second nucleation suppression layer 792 may be formed as discrete material portions that are located on a top surface of a respective one of the second metal bonding pads 788.

In one embodiment, the nucleation suppression material of the second nucleation suppression layer 792 may also be a SAM, such as a SAM monolayer, for example ODTS, DTS or OTS. The nucleation suppression material of the second nucleation suppression layer 792 may be the same as or different from the nucleation suppression material of the first nucleation suppression layer 992.

Figure 7:
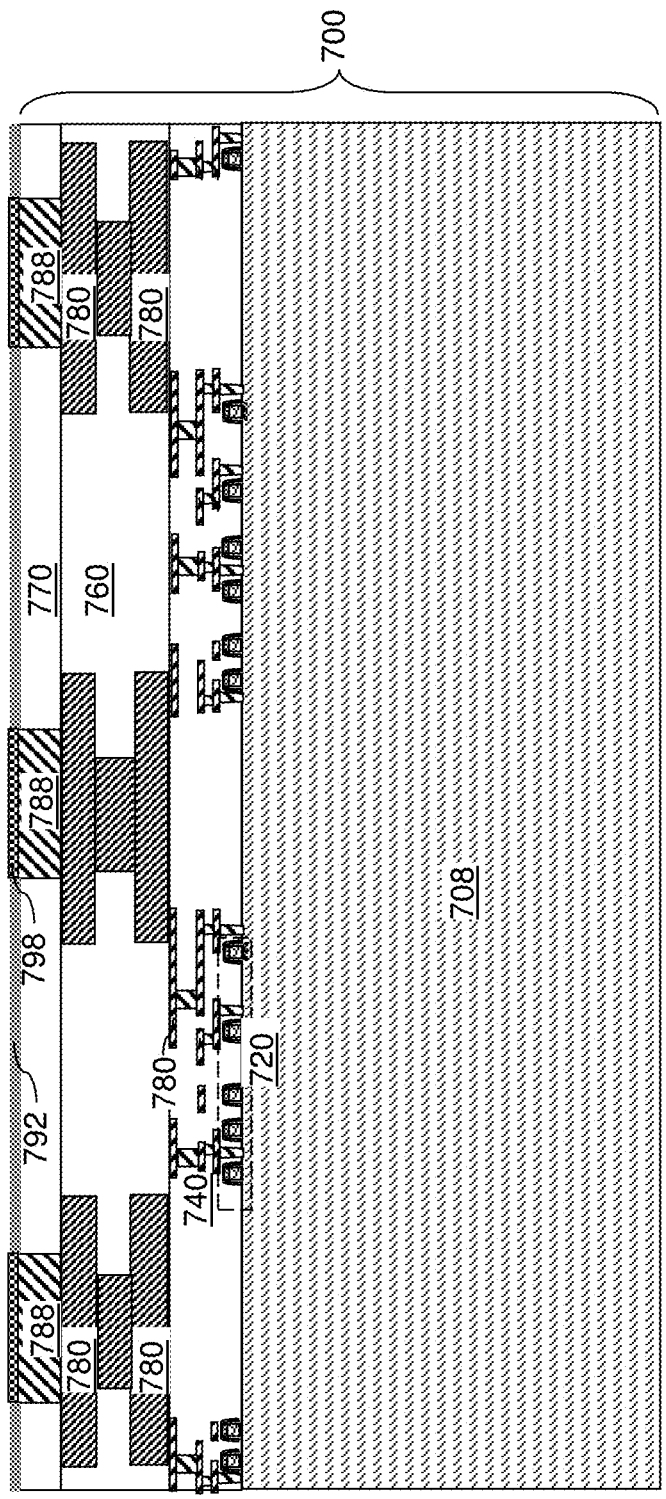
FIG. 7 is a schematic vertical cross-sectional view of the second semiconductor die after selective deposition of second metallic liners according to an embodiment of the present disclosure.

Referring to FIG. 7, an atomic layer deposition (ALD) process can be performed to selectively deposit a third metal on the physically exposed metallic surfaces of the second metal bonding pads 788 without depositing the third metal on the surfaces of the second nucleation suppression layer 792, similar to the method described above with respect to FIG. 4. The third metal is different from the first metal, and may be the same as, or may be different from, the second metal. Generally, the third metal includes a metal that is more resistant to oxidation than the first metal. In one embodiment, the first metal is copper, and the third metal is a noble metal. In an illustrative example, the third metal comprises an element selected from palladium, platinum, iridium, osmium, ruthenium, gold, or silver.

During the atomic layer deposition process, a metalorganic precursor gas including the third metal can be flowed into a process chamber including the second semiconductor die 700. The species of the metalorganic precursor gas can be selected based on the third metal and the material of the second nucleation suppression layer 792 (i.e., the self-assembly material). The metalorganic precursor gas can be selected such that molecules of the metalorganic precursor gas is selectively adsorbed on, and is decomposed over, the physically exposed surfaces of the second metal bonding pads 788 to form second metallic liners 798 consisting essentially of the third metal. Thus, the metalorganic precursor gas nucleates on surfaces of the first metal without nucleating on surfaces of the second nucleation suppression layer 792. The metalorganic precursor gas does not adsorb on the surfaces of the second nucleation suppression layer 792, and thus, the second metallic liners 798 are not formed over the second nucleation suppression layer 792. Generally, the second metallic liners 798 comprising the third metal can be selectively deposited on the physically exposed surfaces of the second metal bonding pads 788 without depositing the third metal on the second nucleation suppression layer 792. The thickness of the second metallic liners 798 can be selected such that the first metal of the second metal bonding pads 788 can diffuse through the second metallic liners 798 during a subsequent anneal process. For example, the thickness of the second metallic liners 798 can be in a range from 2 nm to 15 nm, such as from 5 nm to 10 nm, although lesser and greater thicknesses may also be employed.

Figure 8:
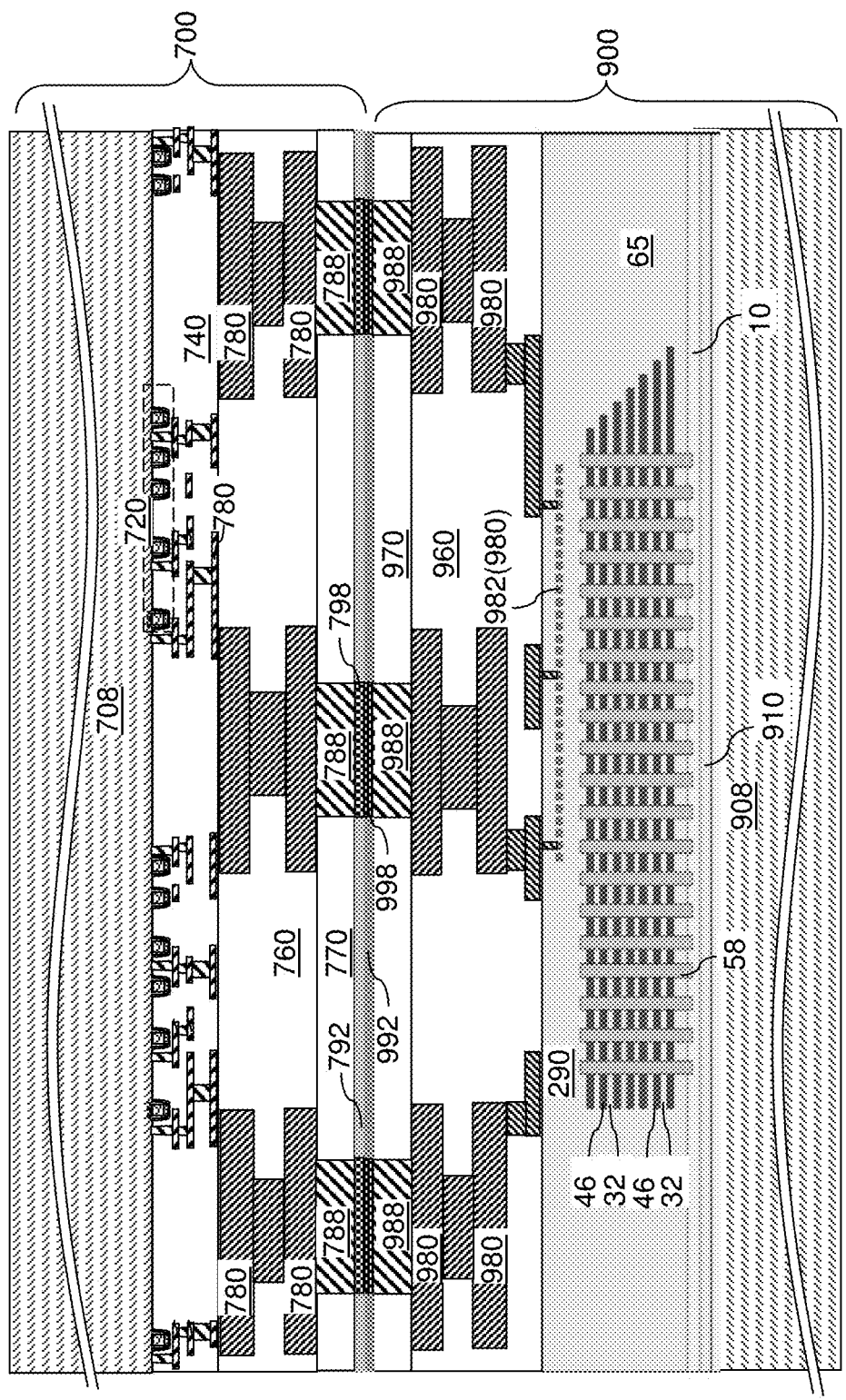
FIG. 8 is a schematic vertical cross-sectional view of an exemplary structure including the first semiconductor die and the second semiconductor die after disposing the second metal bonding pads over the first metal bonding pads according to an embodiment of the present disclosure.

Referring to FIG. 8, the first semiconductor die 900 and the second semiconductor die 700 are oriented such that the first bonding dielectric layer 970 faces the second bonding dielectric layer 770. The first semiconductor die 900 and the second semiconductor die 700 may be laterally aligned such that each second metal bonding pad 788 faces a respective one of the first metal bonding pads 988. In one embodiment, the pattern of the second metal bonding pads 788 may be a mirror image of the pattern of the first metal bonding pads 988 with optional differences in the size of metal bonding pads between the first semiconductor die 900 and the second semiconductor die 700. In one embodiment, the first metal bonding pads 988 and the corresponding second metal bonding pads 788 may have the same size (i.e., lateral width). In another embodiment, the first metal bonding pads 988 and the corresponding second metal bonding pads 788 may have different sizes. In one embodiment, areal overlap between each facing pair of a first metal bonding pad 988 and a second metal bonding pad 788 may be at least 70%, and/or at least 80%, such as at least 90%, for example 90 to 100%, of the area of the smaller one of the first metal bonding pad 988 and the second metal bonding pad 788.

The second semiconductor die 700 and the first semiconductor die 900 are brought into contact such that each of the first metallic liners 998 contacts a respective one of the second metallic liners 798. The pattern of the second metal bonding pads 788 can be a mirror image pattern of the pattern of the first metal bonding pads 988. The area of the second nucleation suppression layer 792 can overlap within the area of the first nucleation suppression layer 992.

Figure 9:
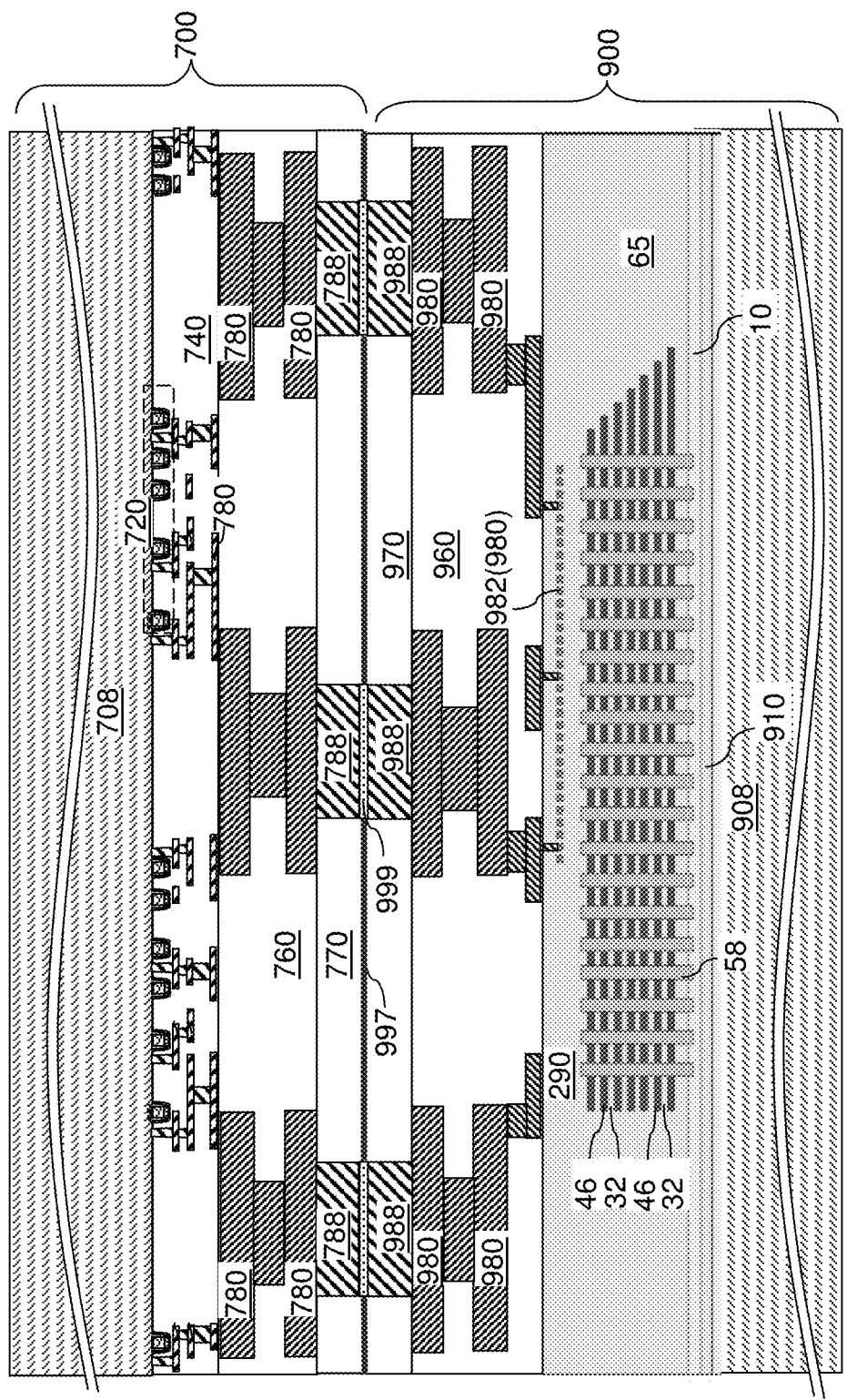
FIG. 9 is a schematic vertical cross-sectional view of the exemplary structure after bonding the second semiconductor die to the first semiconductor die according to an embodiment of the present disclosure.
Figure 10A:
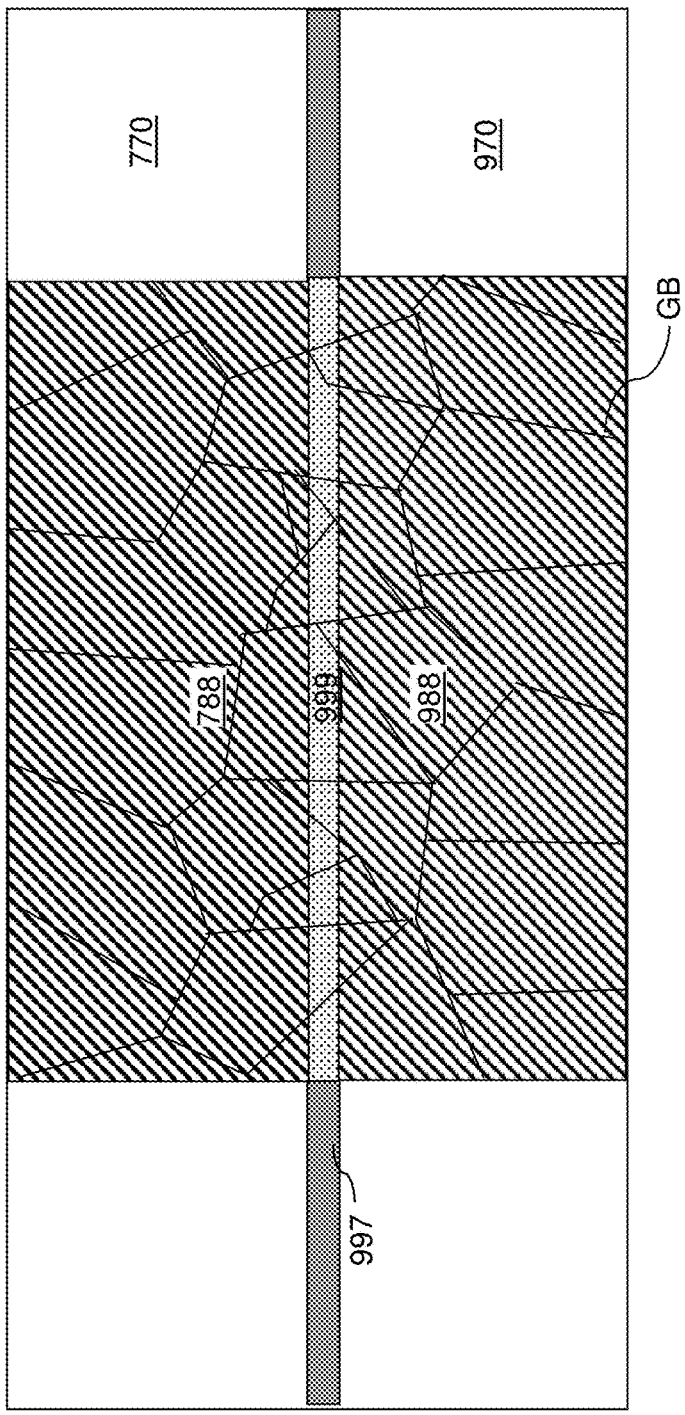
FIG. 10A is a magnified view of a bonded pair of a first metal pad and a second metal pad within the exemplary structure of FIG. 9.
Figure 10B:
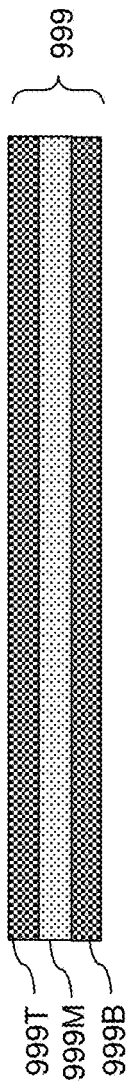
FIG. 10B is a magnified view of an interfacial alloy region within the exemplary structure of FIG. 10A.

Referring to FIGS. 9, 10A and 10B, the second metal bonding pads 788 may be bonded to the first metal bonding pads 988 by performing an anneal process that induces metal-to-metal bonding between the second metal bonding pads 788 and the first metal bonding pads 988. Optionally, dielectric bonding between the first bonding dielectric layers 970 and the second bonding dielectric layer 770 may occur prior to, or simultaneously with, bonding of the first metal bonding pads 988 and the second metal bonding pads 788. Generally, the second metal bonding pads 788 can be bonded with the first metal bonding pads 988 by inducing metal-to-metal bonding between each mating pair of the first metal bonding pads 988 and the second metal bonding pads 788.

According to an aspect of the present disclosure, the first metallic liners 998 and the second metallic liners 798 include metallic materials that are more resistant to oxidation than the first metal of the first metal bonding pads 988 and the second metal bonding pads 788. For example, the first metal may be copper, and the second metal of the first metallic liners 998 and the third metal of the second metallic liners 798 can include palladium, platinum, iridium, osmium, ruthenium, gold, and/or silver that are more resistant to oxidation than copper. Thus, the metal-to-metal bonding temperature at which atoms of the first metal diffuse through a stack of a first metallic liner 998 and a second metallic liner 798 during the anneal process is lowered compared to conventional metal-to-metal bonding processes. For example, if the first metal is copper, the metal-to-metal bonding temperature may be in a range from 150 degrees Celsius to 300 degrees Celsius, such as 225 degrees Celsius to 275 degrees Celsius, including 250 degrees Celsius, compared to the conventional copper-to-copper bonding temperature of about 350 degrees Celsius to 400 degrees Celsius.

According to another aspect of the present disclosure, dielectric-to-dielectric bonding can be performed between the first bonding dielectric layer 970 and the second bonding dielectric layer 770 concurrently with metal-to-metal bonding between the first metal bonding pads 988 and the second metal bonding pads 788. In conventional hybrid bonding processes, dielectric-to-dielectric bonding is performed at a lower temperature first, and metal-to-metal bonding is performed at a higher temperature in a two-step anneal process. According to an aspect of the present disclosure, the metal-to-metal bonding temperature can be lowered due to the presence of the first metallic liners 998 and the second metallic liners 798, and dielectric-to-dielectric bonding and metal-to-metal bonding can occur simultaneously. For example, if the first metal is copper, and the second and third metals of the liners is a noble metal, then the elevated temperature of the single step hybrid bonding anneal process can be in a range from 150 degrees Celsius to 300 degrees Celsius, and have a duration of 1 to 3 hours, such as 2 hours. Thus, the duration of the single step hybrid bonding anneal process may be reduced by about half compared to the prior art two-step sequential hybrid bonding anneal process.

The second metal of the first metallic liners 998 and the third metal of the second metallic liners 798 diffuse into the first metal bonding pads 988 and into the second metal bonding pads 788, while the first metal of the first and second metal bonding pads diffuses into and through the liners (798, 998). Thus, an interfacial alloy region 999 is formed between each bonded pair of a first metal bonding pad 988 and a second metal bonding pad 788, as shown in FIG. 10A.

In one embodiment shown in FIG. 10B, the first metal (e.g., copper) may diffuse from the respective bonding pads (788, 988) through the respective noble metal liners (798, 998) to form a copper-rich middle region 999M between a bottom noble metal-rich rich region 999B and a top noble metal-rich region 999T in the interfacial alloy region 999. The copper-rich middle region 999M has a higher copper content than the copper content of the bottom noble metal-rich rich region 999B and the top noble metal-rich region 999T. In contrast, the copper-rich middle region 999M has a lower noble metal content than the noble metal content of the bottom noble metal-rich rich region 999B and the top noble metal-rich region 999T. For example, the copper-rich middle region 999M may comprise 75 to 95 atomic percent, such as 80 to 90 atomic percent copper, and 5 to 25 atomic percent, such as 10 to 20 atomic percent noble metal. The bottom noble metal-rich rich region 999B and the top noble metal-rich region 999T may comprise 50 to 70 atomic percent, such as 55 to 65 atomic percent copper, and 30 to 50 atomic percent, such as 35 to 45 atomic percent noble metal. The interfaces between the copper-rich middle region 999M and the noble metal-rich rich region 999B and the top noble metal-rich region 999T, and the interfaces between the noble metal-rich regions (999B, 999T) and the respective copper bonding pads (788, 988) may be graded in copper and noble metal concentration rather than abrupt in copper and noble metal concentration.

As shown in FIG. 10A, in one embodiment the grains of the first metal (which are copper grains in case the first metal is copper) near the bonding interface between the first semiconductor die 900 and the second semiconductor die 700 may extend across the interfacial alloy region 999. Generally, a subset of crystalline grains may extend vertically through an interfacial alloy region 999 into a proximal portion of the respective one of the first metal bonding pads 988 and into the respective one of the second metal bonding pads 788. Furthermore, a number of smaller grains may be formed at the bonding interface. Grain boundaries GB are schematically illustrated in FIG. 10A.

The first nucleation suppression layer 992 and the second nucleation suppression layer 792 can be thermally decomposed during the bonding process to form an interfacial doped dielectric material layer 997. The interfacial doped dielectric material layer 997 may be present at the bonding interface between the first bonding dielectric layer 970 and the second bonding dielectric layer 770. The interfacial doped dielectric material layer 997 can include SAM residue, such as residual carbon atoms, and optionally residual chlorine atoms. In one embodiment, integrated areal density of carbon atoms at the bonding interface (i.e., a quantity obtained by integrating the density of the carbon atoms along the vertical direction across the bonding interface) may be in a range from $3\times10^{13}/cm^2$ to $3\times10^{15}/cm^2$, although lesser and greater integrated areal density of carbon atoms may be employed. In one embodiment, integrated areal density of chlorine atoms at the bonding interface (i.e., a quantity obtained by integrating the density of the chlorine atoms along the vertical direction across the bonding interface) may be in a range from $3\times10^{13}/cm^2$ to $1\times10^{15}/cm^2$, although lesser and greater integrated areal density of chlorine atoms may be employed.

Generally, dielectric-to-dielectric bonding can be induced between the first bonding dielectric layer 970 and the second bonding dielectric layer 770 during an anneal process that induces metal-to-metal bonding between each mating pair of the first metal bonding pads 988 and the second metal bonding pads 788.

Figure 11:
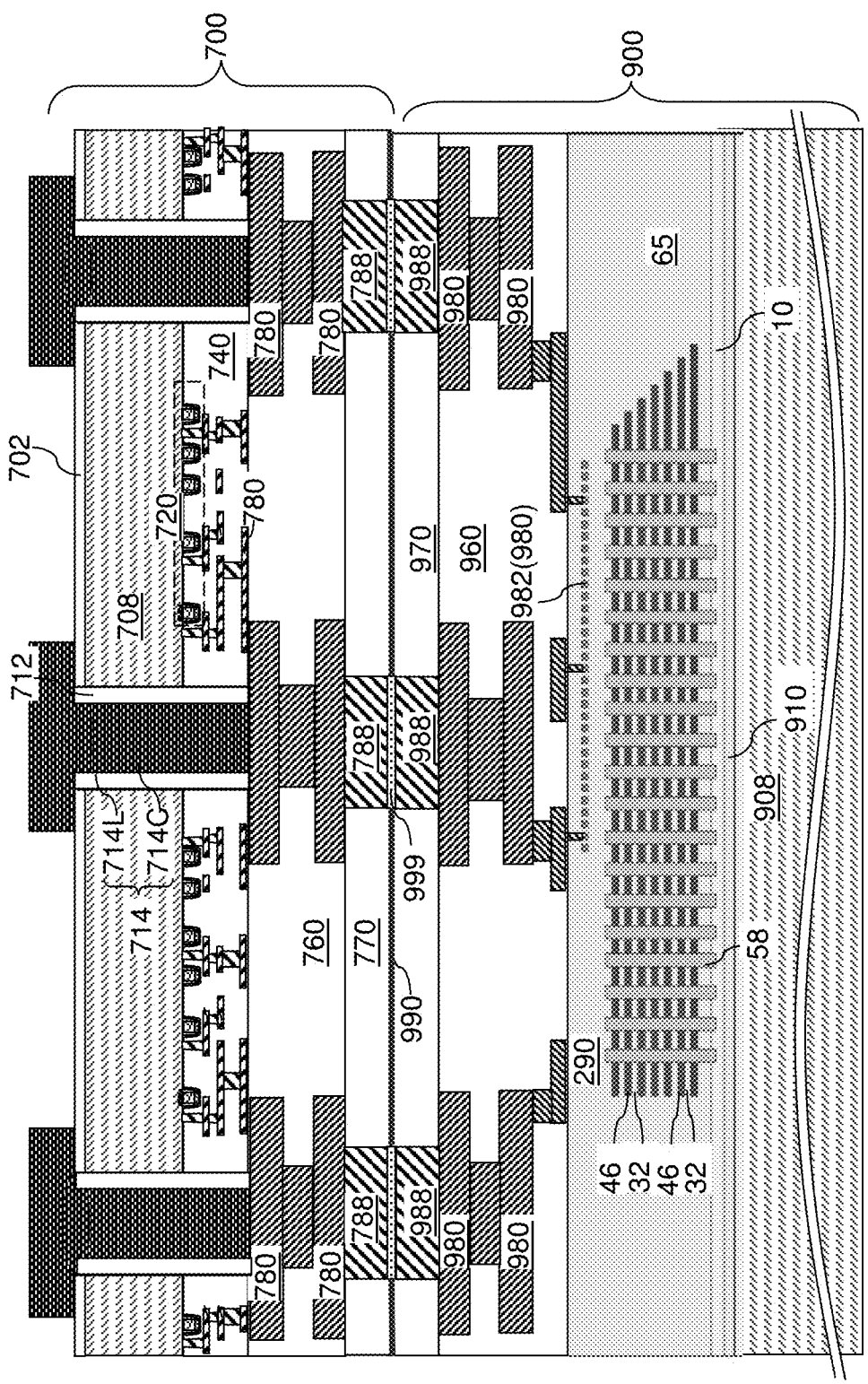
FIG. 11 is a schematic vertical cross-sectional view of the exemplary structure after thinning the first substrate and forming through-substrate via structures through the first substrate according to an embodiment of the present disclosure.

Referring to FIG. 11, the backside of the first substrate 908 and the second substrate 708 may be optionally thinned. Optional through-substrate contact via structures 714 may be formed through the second substrate 708 or through the first substrate 908. The second substrate 708 (or the first substrate 908) may be thinned from the backside by grinding, polishing, an anisotropic etch, or an isotropic etch. A backside insulating layer 702 may be formed on the backside of the second substrate 708. A photoresist layer (not shown) may be applied on the backside of the second substrate 708, and may be lithographically patterned to form opening therethrough. The location of the openings through the patterned photoresist layer may be selected such that each opening through the photoresist layer is located entirely within the area of a respective one of the second metal interconnect structures 780.

An anisotropic etch process may be performed using the patterned photoresist layer as an etch mask layer. The anisotropic etch process may etch through unmasked regions of the second substrate 708 and through the proximal interconnect-level dielectric material layers 740. The etch chemistries of the various steps of the anisotropic etch process may be selected to etch through the various unmasked material portions, and the terminal step of the anisotropic etch process may include an etch chemistry that anisotropically etches one of the proximal interconnect-level dielectric material layers 740 selective to the metallic material of the second metal interconnect structures.

Via cavities extending at least through the second substrate 708 and the proximal interconnect-level dielectric material layers 740 may be formed. The via cavities are herein referred to as through-substrate via cavities. Each of the through-substrate via cavities may include a respective vertical or substantially vertical sidewall, and vertically extends from the backside surface of the second substrate 708 to a proximal surface of a respective one of the second metal interconnect structures 780, which may be a metal pad. Thus, a proximal surface of a second metal interconnect structure 780 (such as a proximal surface of a metal bonding pad) is physically exposed at the bottom of each through-substrate via cavity.

At least one electrically conductive material such as at least one metallic material may be deposited in the through-substrate via cavities. The at least one conductive material may include, for example, a metallic nitride liner material such as TiN, TaN, and/or WN, and a metallic fill material such as W, Co, Cu, Ru, and/or Mo. The at least one conductive material may be deposited by physical vapor deposition or chemical vapor deposition or atomic layer deposition or electrochemical deposition or electro-less deposition or combinations thereof. The at least one conductive material may be patterned into discrete portions to provide through-substrate via structures 714. The upper portion of each through-substrate via structure 714 that protrudes above the backside insulating layer 702 includes a metallic pad structure, which may be used as an external metal bonding pad. Each through-substrate via structure 714 may include a metallic nitride liner 714L and a metallic fill material portion 714C.

Referring to all drawings and according to various embodiments of the present disclosure, a bonded assembly comprises a first semiconductor die 900 comprising first semiconductor devices 720, first metal interconnect structures 980 embedded in first dielectric material layers 960, and first metal bonding pads 988 comprising a first metal and embedded in a first bonding dielectric layer 970, a second semiconductor die 700 comprising second semiconductor devices 720, second metal interconnect structures 780 embedded in second dielectric material layers 760, and second metal bonding pads 788 comprising the first metal and embedded in a second bonding dielectric layer 770 and bonded to a respective one of the first metal bonding pads 988. The bonded assembly also comprises interfacial alloy regions 999 comprising an alloy of the first metal and a second metal that is different from the first metal located between each of the first metal bonding pads 988 and each of the second metal bonding pads 788 bonded to the respective one of the first metal bonding pads 988, and an interfacial dielectric region 997 located at an interface between the first bonding dielectric layer 970 and the second bonding dielectric layer 770. The interfacial dielectric region 997 comprises carbon atoms at an average atomic concentration that is greater than twice an average atomic concentration of carbon in the first bonding dielectric layer 970 and is greater than twice an average atomic concentration of carbon in the second bonding dielectric layer 770.

In one embodiment, the first metal comprises copper, and the second metal comprises a noble metal. In one embodiment shown in FIG. 10B, each of the interfacial alloy regions 999 comprises a copper-rich middle region 999M located between a bottom noble metal-rich rich region 999B and a top noble metal-rich region 999T. The copper-rich middle region 999M has a higher copper content than the copper content of the bottom noble metal-rich rich region 999B and the top noble metal-rich region 999M. The copper-rich middle region 999M has a lower noble metal content than the noble metal content of the bottom noble metal-rich rich region 999B and the top noble metal-rich region 999T.

In one embodiment, an atomic concentration of the second metal decreases with a vertical distance from the interfacial alloy regions 999 and the first and second metal bonding pads (988, 788). Optionally, a multilayer interface may be present at the interfacial alloy regions 999. In one embodiment shown in FIG. 10A, a subset of crystalline grains extend vertically through the interfacial alloy regions 999 into a proximal portion of the respective one of the first metal bonding pads and into the respective one of the second metal bonding pads. In one embodiment the interfacial alloy regions 999 have a thickness that is less than 10% of a vertical thickness of the first and the second metal bonding pads (988, 788).

In one embodiment, the first bonding dielectric layer 970 is bonded to the second bonding dielectric layer 770 by dielectric-to-dielectric bonding. In one embodiment, the first bonding dielectric layer and the second bonding dielectric layer comprise silicon oxide or silicon nitride. In another embodiment, the first bonding dielectric layer and the second bonding dielectric layer comprise silicon carbide nitride. In one embodiment, the interfacial dielectric region 997 comprises both carbon and chlorine atoms at an average atomic concentration that is greater than twice an average atomic concentration of both carbon and chlorine in the first bonding dielectric layer 970 and is greater than twice an average atomic concentration of both carbon and chlorine in the second bonding dielectric layer 770.

The various embodiments of the present disclosure can be employed to provide metal-to-metal bonding and dielectric-to-dielectric bonding simultaneously. The first metallic liners 998 and the second metallic liners 798 reduce or prevent oxidation of surfaces of the first metal bonding pads 988 and the second metal bonding pads 788. Thus, hybrid bonding, which includes metal-to-metal bonding, may be performed at a lower bonding temperature and/or a shorter duration. Reducing the thermal budget for hybrid bonding can reduce or avoid thinned semiconductor die, wafer fragility and performance degradation, while improving bonding alignment accuracy and avoiding the compatibility issue with a back end of the line process.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A method of forming a bonded assembly, comprising:
providing a first semiconductor die comprising first semiconductor devices, a first bonding dielectric layer, and first metal bonding pads that comprise a first metal, are electrically connected to a respective node of the first semiconductor devices, and are embedded in the first bonding dielectric layer;
selectively depositing a first nucleation suppression layer comprising a self-assembly material on a surface of the first bonding dielectric layer without depositing the self-assembly material on physically exposed surfaces of the first metal bonding pads;
selectively depositing first metallic liners comprising a second metal on the physically exposed surfaces of the first metal bonding pads without depositing the second metal on the first nucleation suppression layer;
providing a second semiconductor die comprising second semiconductor devices, a second bonding dielectric layer, and second metal bonding pads that are electrically connected to a respective node of the second semiconductor devices, and are embedded in the second bonding dielectric layer;
selectively depositing a second nucleation suppression layer comprising an additional self-assembly material on a surface of the second bonding dielectric layer without depositing the additional self-assembly material on physically exposed surfaces of the second metal bonding pads;
selectively depositing a second metallic liner comprising a third metal on the physically exposed surfaces of the second metal bonding pads without depositing the third metal on the second nucleation suppression layer, wherein the third metal is different from the first metal, and is the same as or is different from the second metal; and
bonding the second metal bonding pads with the first metal bonding pads by inducing metal-to-metal bonding between each mating pair of the first metal bonding pads and the second metal bonding pads.

2. The method of claim 1, wherein:
the first metal comprises copper; and
the second metal comprises a noble metal.

3. The method of claim 2, wherein the metal-to-metal bonding is induced by performing an anneal process at a temperature between 150 degrees Celsius and 300 degrees Celsius.

4. The method of claim 3, wherein during the anneal process the copper diffuses from the respective first and second metal bonding pads through the respective first and second metal liners to form an interfacial alloy region between the respective first and second metal bonding pads.

5. The method of claim 4, wherein:

the interfacial alloy region comprises a copper-rich middle region located between a bottom noble metal-rich rich region and a top noble metal-rich region;

the copper-rich middle region has a higher copper content than the copper content of the bottom noble metal-rich rich region and the top noble metal-rich region; and the copper-rich middle region has a lower noble metal content than the noble metal content of the bottom noble metal-rich rich region and the top noble metal-rich region.

6. The method of claim 4, wherein a subset of crystalline grains extend vertically through the interfacial alloy region into a proximal portion of the respective one of the first metal bonding pads and into the respective one of the second metal bonding pads.

7. The method of claim 3, further comprising inducing dielectric-to-dielectric bonding between the first bonding dielectric layer and the second bonding dielectric layer during the anneal process.

8. The method of claim 1, wherein:

the self-assembly material comprises a material selected from octadecyltrichlorosilane, decyltrichlorosilane, or octylsilane; and the first bonding dielectric layer and the second bonding dielectric layer comprise silicon oxide, silicon nitride or silicon carbide nitride.

9. The method of claim 1, wherein the first metallic liners are deposited by performing an atomic layer deposition (ALD) process employing a precursor gas that nucleates on surfaces of the first metal without nucleating on surfaces of the first nucleation suppression layer.

10. A bonded assembly, comprising:

a first semiconductor die comprising first semiconductor devices, first metal interconnect structures embedded in first dielectric material layers, and first metal bonding pads comprising a first metal and embedded in a first bonding dielectric layer;

a second semiconductor die comprising second semiconductor devices, second metal interconnect structures embedded in second dielectric material layers, and second metal bonding pads comprising the first metal and embedded in a second bonding dielectric layer and bonded to a respective one of the first metal bonding pads;

interfacial alloy regions comprising an alloy of the first metal and a second metal that is different from the first metal located between each of the first metal bonding pads and each of the second metal bonding pads bonded to the respective one of the first metal bonding pads; and an interfacial dielectric region located at an interface between the first bonding dielectric layer and the second bonding dielectric layer, wherein the interfacial dielectric region comprises carbon atoms at an average atomic concentration that is greater than twice an average atomic concentration of carbon in the first bonding dielectric layer and is greater than twice an average atomic concentration of carbon in the second bonding dielectric layer.

11. The bonded assembly of claim 10, wherein:

the first metal comprises copper; and the second metal comprises a noble metal.

12. The bonded assembly of claim 11, wherein:

each of the interfacial alloy regions comprises a copper-rich middle region located between a bottom noble metal-rich rich region and a top noble metal-rich region;

the copper-rich middle region has a higher copper content than the copper content of the bottom noble metal-rich rich region and the top noble metal-rich region; and the copper-rich middle region has a lower noble metal content than the noble metal content of the bottom noble metal-rich rich region and the top noble metal-rich region.

13. The bonded assembly of claim 12, wherein an atomic concentration of the second metal decreases with a vertical distance from the interfacial alloy regions and the first and second metal bonding pads.

14. The bonded assembly of claim 10, wherein a subset of crystalline grains extend vertically through the interfacial alloy regions into a proximal portion of the respective one of the first metal bonding pads and into the respective one of the second metal bonding pads.

15. The bonded assembly of claim 10, wherein the interfacial alloy regions have a thickness that is less than 10% of a vertical thickness of the first and the second metal bonding pads.

16. The bonded assembly of claim 10, wherein the first bonding dielectric layer is bonded to the second bonding dielectric layer by dielectric-to-dielectric bonding.

17. The bonded assembly of claim 16, wherein the first bonding dielectric layer and the second bonding dielectric layer comprise silicon oxide.

18. The bonded assembly of claim 16, wherein the first bonding dielectric layer and the second bonding dielectric layer comprise silicon carbide nitride.

19. The bonded assembly of claim 10, wherein the interfacial dielectric region comprises both carbon and chlorine atoms at an average atomic concentration that is greater than twice an average atomic concentration of both carbon and chlorine in the first bonding dielectric layer and is greater than twice an average atomic concentration of both carbon and chlorine in the second bonding dielectric layer.

\* \* \* \* \*